(12) United States Patent
Kuznetsov et al.

(10) Patent No.: US 7,787,205 B2
(45) Date of Patent: Aug. 31, 2010

(54) DETECTING AND CORRECTING INSERTION AND DELETION OF BITS FOR BIT PATTERNED MEDIA STORAGE SYSTEMS

(75) Inventors: Alexander Vasilievich Kuznetsov, Pittsburgh, PA (US); Mehmet Fatih Erden, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 401 days.

(21) Appl. No.: 11/866,241

(22) Filed: Oct. 2, 2007

(65) Prior Publication Data

US 2009/0086356 A1 Apr. 2, 2009

(51) Int. Cl.
*G11B 5/09* (2006.01)
(52) U.S. Cl. .......................................... 360/53; 360/31
(58) Field of Classification Search .................. None
See application file for complete search history.

(56) References Cited

U.S. PATENT DOCUMENTS

| | | | |
|---|---|---|---|
| 6,643,082 B1 | 11/2003 | Belser | 360/48 |
| 6,658,922 B2 | 12/2003 | Leigh et al. | 73/105 |
| 6,738,207 B1 | 5/2004 | Belser et al. | 360/31 |
| 6,751,035 B1 | 6/2004 | Belser | 360/48 |
| 6,898,037 B2 | 5/2005 | Leigh et al. | 360/55 |
| 7,423,825 B2 * | 9/2008 | Shimamura et al. | 360/31 |
| 2002/0171969 A1 | 11/2002 | Leigh et al. | 360/77.03 |
| 2002/0191505 A1 * | 12/2002 | Horibata et al. | 369/47.3 |
| 2006/0168503 A1 * | 7/2006 | Schroeder et al. | 714/798 |
| 2007/0008864 A1 | 1/2007 | Fan et al. | 369/126 |
| 2007/0271216 A1 * | 11/2007 | Patterson | 707/1 |
| 2008/0304173 A1 * | 12/2008 | Albrecht et al. | 360/51 |

* cited by examiner

*Primary Examiner*—Jason C Olson
(74) *Attorney, Agent, or Firm*—David D. Brush; Westman, Champlin & Kelly, P.A.

(57) ABSTRACT

A method of determining errors in a data storage device is disclosed. The disclosed method includes receiving a first code word from the data storage device. The method further includes determining whether a data error exists in the code word by analyzing a plurality of subsequent code words. Detecting a data error includes calculating first, second, and third checksums for each of a plurality of subsequent code words and determining whether there is an insertion or deletion error based on the calculated checksums. A further method includes receiving location information of errors on a data medium and adjusting a write clock frequency to reduce the probability of creating errors on the data medium during a write process.

20 Claims, 15 Drawing Sheets

| Deficiency Δ | $c_1$ | $c_2$ | $c_3$ | $c_4$ | $c_5$ |
|---|---|---|---|---|---|
| 0 | 0 | 0 | 0 | 0 | 0 |
| 1 | 1 | 0 | 0 | 0 | 0 |
| 2 | 0 | 1 | 0 | 0 | 0 |
| 3 | 1 | 1 | 0 | 0 | 0 |
| 4 | 0 | 0 | 1 | 0 | 0 |
| 5 | 1 | 0 | 1 | 0 | 0 |
| 6 | 0 | 1 | 1 | 0 | 0 |
| 7 | 1 | 1 | 1 | 0 | 0 |
| 8 | 0 | 0 | 0 | 1 | 0 |
| 9 | 1 | 0 | 0 | 1 | 0 |
| 10 | 0 | 1 | 0 | 1 | 0 |
| 11 | 1 | 1 | 0 | 1 | 0 |
| 12 | 0 | 0 | 1 | 1 | 0 |
| 13 | 1 | 0 | 1 | 1 | 0 |
| 14 | 0 | 1 | 1 | 1 | 0 |
| 15 | 1 | 1 | 1 | 1 | 0 |
| 16 | 0 | 0 | 0 | 0 | 1 |
| 17 | 1 | 0 | 0 | 0 | 1 |
| 18 | 0 | 1 | 0 | 0 | 1 |
| 19 | 1 | 1 | 0 | 0 | 1 |
| 20 | 0 | 0 | 1 | 0 | 1 |
| 21 | 1 | 0 | 1 | 0 | 1 |
| 22 | 0 | 1 | 1 | 0 | 1 |
| 23 | 1 | 1 | 1 | 0 | 1 |
| 24 | 0 | 0 | 0 | 1 | 1 |
| 25 | 1 | 0 | 0 | 1 | 1 |
| 26 | 0 | 1 | 0 | 1 | 1 |
| 27 | 1 | 1 | 0 | 1 | 1 |
| 28 | 0 | 0 | 1 | 1 | 1 |
| 29 | 1 | 0 | 1 | 1 | 1 |
| 30 | 0 | 1 | 1 | 1 | 1 |
| 31 | 1 | 1 | 1 | 1 | 1 |

FIG. 10

DETECTING AND CORRECTING INSERTION AND DELETION OF BITS FOR BIT PATTERNED MEDIA STORAGE SYSTEMS

FIELD OF THE DISCLOSURE

The present invention relates generally to data storage systems and more particularly but not by limitation to the detection and correction of write errors during the data readback process.

BACKGROUND

The density of data stored on data storage systems such as disc drives has increased steadily as the need for more and more data storage has continued to increase. To increase the overall density of the data stored on a given sized data storage device the amount of area devoted to each bit of data necessarily decreases. For example, data tracks that are configured to store a plurality of bits in a linear or arcuate arrangement become narrower and shorter. One of the consequences of increased areal density of data on a data storage system is that as the data tracks become smaller, the area devoted to each bit can become so small that the superparamagnetic limit is reached. At that point, the ability of the data storage medium to reliably store information is compromised.

One approach to increasing the areal density of material on data storage media is to utilize a bit pattern medium, which has a single grain of material for each bit of data stored on the data storage medium. The resultant data tracks are smaller than those using conventional approaches with multiple grains are. However, each bit is isolated from every other bit in a data track, requiring that data writes be synchronized to prevent the introduction of errors.

Embodiments of the present invention provide solutions to these and other problems, and offer other advantages over the prior art.

SUMMARY

In one aspect, a method is discussed. The method includes receiving a first code word from a data storage device and determining whether a data error exists in the code word by analyzing a plurality of subsequent code words.

In another aspect, another method is discussed. The method includes receiving location information of errors on a data medium and adjusting a write clock frequency to reduce the probability of creating errors on the data medium during a write process.

In still another aspect, yet another method for detecting an insertion or deletion error is discussed. The method includes receiving a first code word. The method further includes calculating first, second and third checksums for each of a plurality of subsequent code words and detecting an error in the first code word based on the calculated checksums.

Other features and benefits that characterize embodiments of the present invention will be apparent upon reading the following detailed description and review of the associated drawings.

BRIEF DESCRIPTION OF THE DRAWINGS

FIG. 10 illustrates an example of a memory to be used to store redundancy bits for use with the encoder of FIG. 9.

DETAILED DESCRIPTION

To facilitate an understanding of the present invention, it is described hereinafter in the context of specific embodiments. In particular, reference is made to the implementation of the invention in a patterned magnetic hard disk media for a hard disk drive. It will be appreciated, however, that the practical applications of the invention are not limited to these particular embodiments. Rather, the invention can be employed in other types of magnetic recording media, one example being magneto-optical hard disk media or other types of recording media.

Figure 1:
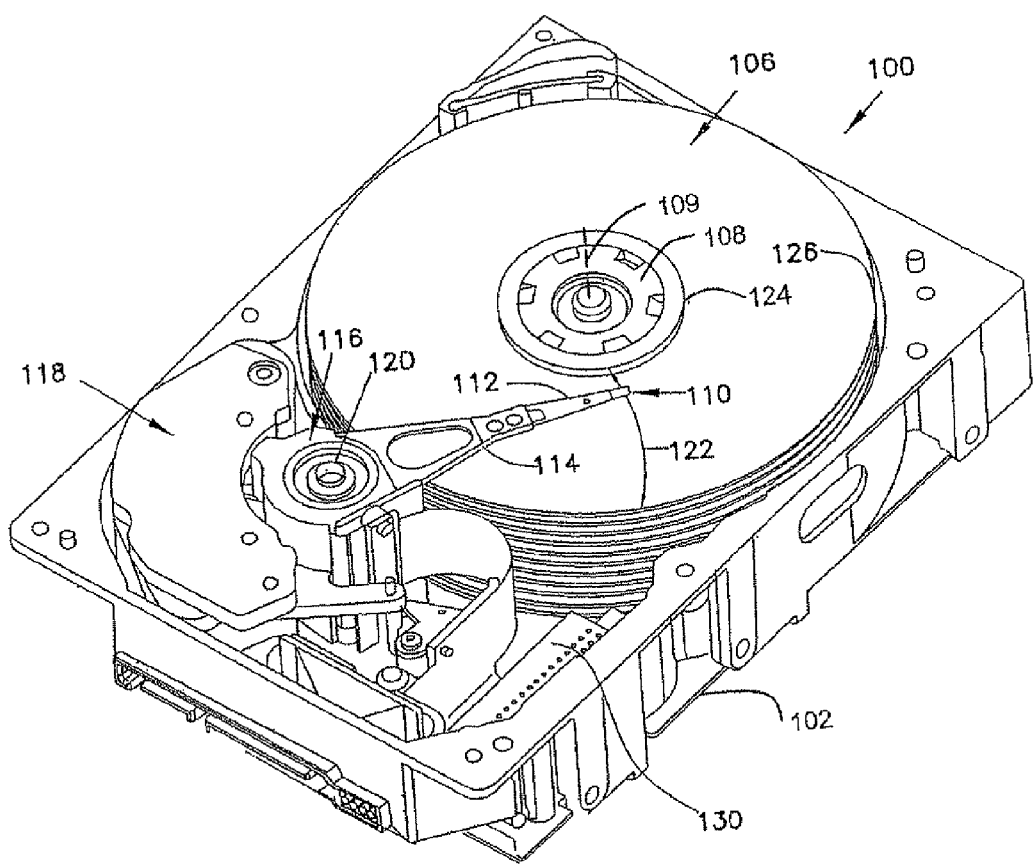
FIG. 1 is an isometric view of a disk drive.

FIG. 1 is an isometric view of a disk drive 100 in which the aspects of the invention discussed herein are useful. Disk drive 100 includes a housing with a base 102 and a top cover (not shown). Disk drive 100 further includes a disk pack 106, which is mounted on a spindle motor (not shown) by a disk clamp 108. Disk pack 106 includes a plurality of individual disks, which are mounted for co-rotation about central axis 109. Each disk surface has an associated disk head slider 110 which is mounted to disk drive 100 for communication with the disk surface to read and/or write data onto the disk surface, which acts as a data storage medium. An interactive element (134 in FIG. 2) attached to the head slider 110 is positioned in close proximity to the disk surface. The interactive element is configured to read and/or write information on the disk surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached sliders 110 about a pivot shaft 120 to position heads 110 over a desired data track along an arcuate path 122 between a disk inner diameter 124 and a disk outer diameter 126. Voice coil motor 118 is driven by servo electronics 130 based on signals generated by interactive elements (134 in FIG. 2) located on sliders 110 and a host computer (not shown).

Figure 2:
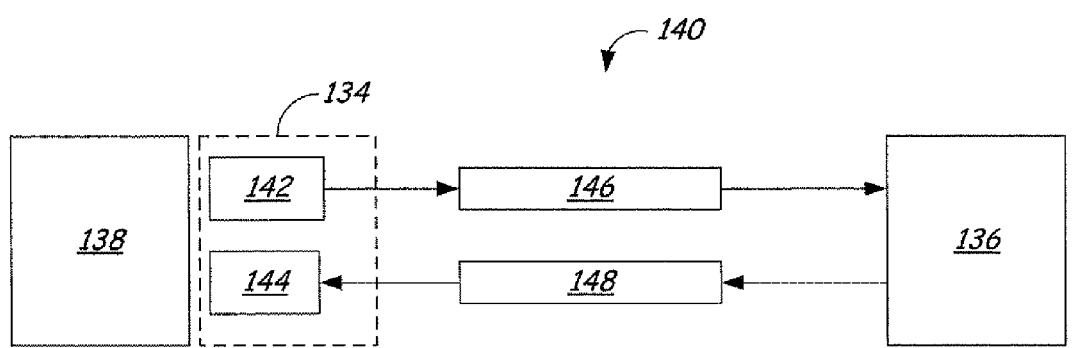
FIG. 2 is a block diagram illustrating read/write channel architecture for a disk drive of the type shown in FIG. 1

FIG. 2 illustrates a block diagram of an illustrative channel architecture 140. Channel architecture 140 provides communication paths between a host 136 and a data storage medium 138. The host 136 is preferably a computer or a computer system and the data storage medium is, for this illustrative example, a disk surface as described above. An interactive element 134 illustratively includes a read data head 142 and a write data head 144. Each of the read data head 142 and the write data head 144 are located in close proximity to the data storage medium 138. The read data head 142 reads data from the data storage medium 138. The data is then provided to a read channel 146, which compensates the data before it is provided to the host 136. Data that is to be written onto the data storage medium 138 from the host 136 is provided to a write channel 148 which compensates the data and sends it to the write data head 144, which writes the data onto the data storage medium 138.

Figure 3:
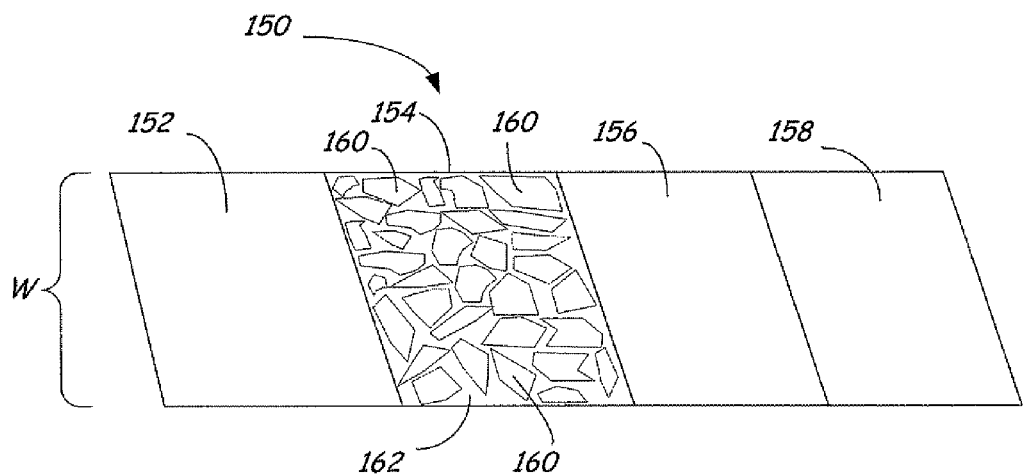
FIG. 3 is a diagram illustrating a data track from a data storage device having data bits with multiple grains of magnetic material.

Data stored on the surface of the disk drive is typically arranged in a series of data tracks FIG. 3 is a schematic illustration a portion of a typical data track 150 that includes a plurality of data bits 152, 154, 156, and 158. Data bit 154 illustratively shows a plurality of grains 160 that are present in each of the data bits of data track 150. The grains 160 are separated from each other by non-magnetic spaces 162. The grains 160 collectively hold a magnetic orientation indicative of the value assigned to a particular data bit. As the size of the data track becomes smaller, the corresponding data bits also decrease in size. As the data bits decrease in size, the number of grains 160 in each data bit decreases in number. Eventually as the size of the data bit decreases, the number of grains decrease to the point to where the superparamagnetic limit is reached. In this case, the data bits can no longer reliably hold an orientation representative of a particular bit of data and therefore cannot reliably hold the data intended to be stored on them.

Figure 4:
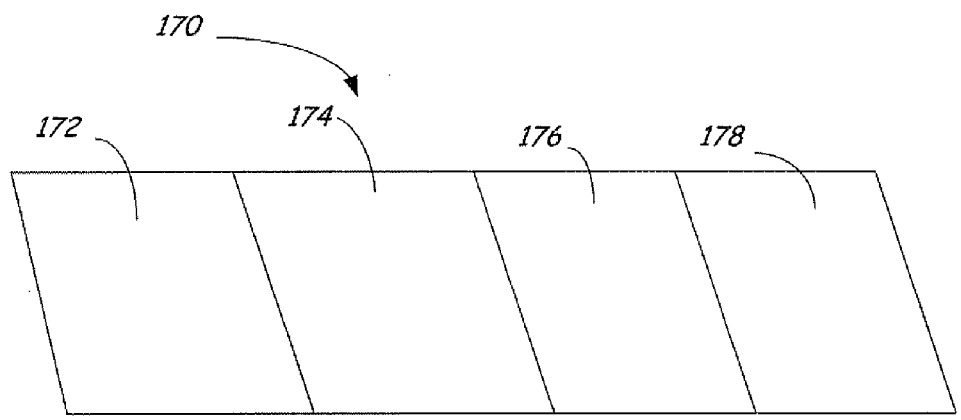
FIG. 4 is a diagram illustrating a data track having data bits with each data bit having a single grain of magnetic material.

FIG. 4 illustrates a portion of a data track 170, illustrating data bits 172, 174, 176, and 178. Each of the data bits 172-178 is illustratively formed with a single grain that covers the entire area of the data bit as opposed to the plurality of grains 160 illustrated in FIG. 3. As a result, the amount of magnetic material is increased for the same size of data track, thereby allowing for smaller data tracks without approaching the superparamagnetic limit. Because the data bits 172-178 each include the single grain arrangement that covers the entire area of the surface designated for a particular bit, it is necessary to provide non-magnetic spaces between the data bits so that an individual orientation can be applied to each bit. Thus, the data track 170, as illustrated in FIG. 4, necessarily requires the addition of non-magnetic spaces or else the entire data track 170 would function as a single data bit.

Figure 5A:
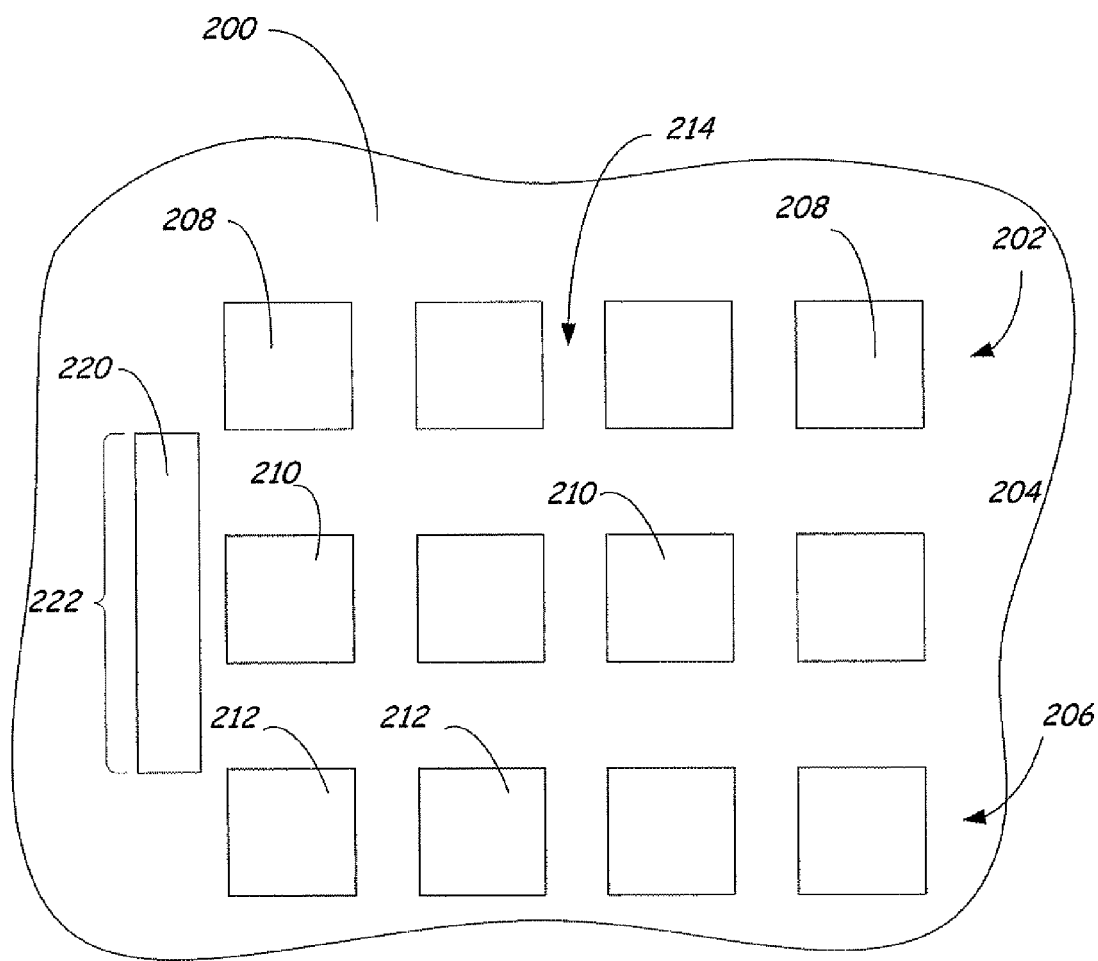
FIG. 5A is a schematic illustration of a portion of a data storage medium illustrating portions of data tracks utilizing a bit patterned media arrangement with a single row of data bits per data track.

FIG. 5A illustrates a portion of a data medium 200 showing a portion of a plurality of data tracks 202, 204, and 206. The first data track 202 has a series of data bits 208 that are arranged in a bit pattern with a non-magnetic space 214 between each of the data bits 208. Similarly, the second data track 204 has a plurality of data bits 210 arranged on data medium 200 in a bit pattern so that non-magnetic space 214 is positioned between the data bits 210. The same arrangement is illustrated for the third data track 206, which has a plurality of data bits 212 spaced apart by non-magnetic material 214. Interactive element 220 is shown positioned adjacent to second data track 204. The interactive element 220 is illustratively configured to be positioned in close proximity with the data bits 210 and the second data track 204 to read and/or write the information on each of the individual data bits 210 as the data medium 200 and the interactive element 220 move relative to each other.

Figure 5B:
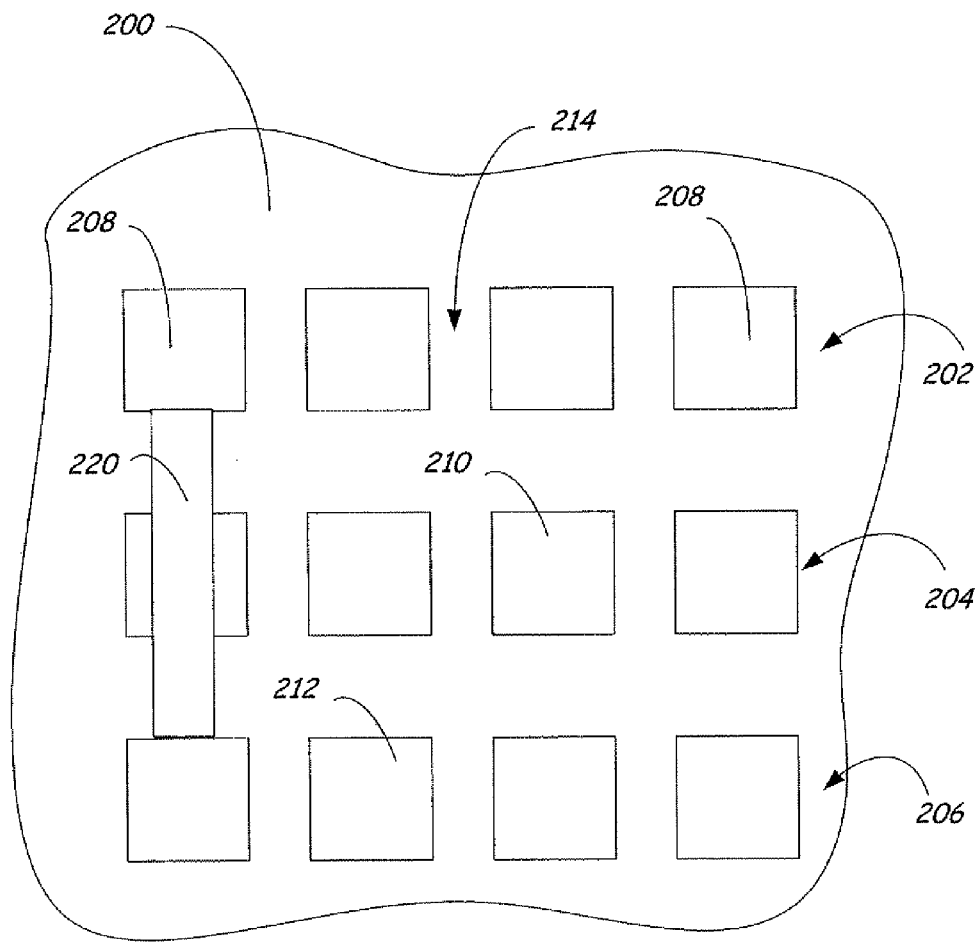
FIG. 5B is a schematic diagram illustrating the positioning of an interactive element positioned over one of the data tracks illustrated in FIG. 4A showing the potential for inter-track interference during read or write operations.

However, as is illustrated in FIG. 5B, when the interactive element 220 is positioned directly over the second data track 204, the arrangement of the first data track 202, the second data track 204, and the third data track 206 are closely positioned together. Therefore, when the interactive element 220 is positioned directly over a data bit 210 of the second data track 204 the interactive element may also be positioned over a portion of data bits 208 and 212 in the first data track 202 and the third data track 206. This can cause inter-track interference, which can cause a misread of data bit 210 and/or a miswrite of data bit 208, 210, or 212. It should be appreciated that the interactive element 220 has a length 222, which is similar to a width W of data track 150. By using the bit pattern media arrangement illustrated in FIGS. 4A and 4B, the width of the individual tracks has been reduced to the point where the interactive element 220 can no longer pass over just one data track. Of course, the data tracks can be spaced further apart, but that would reduce or eliminate the gain in areal density achieved by creating small data bits.

Figure 6:
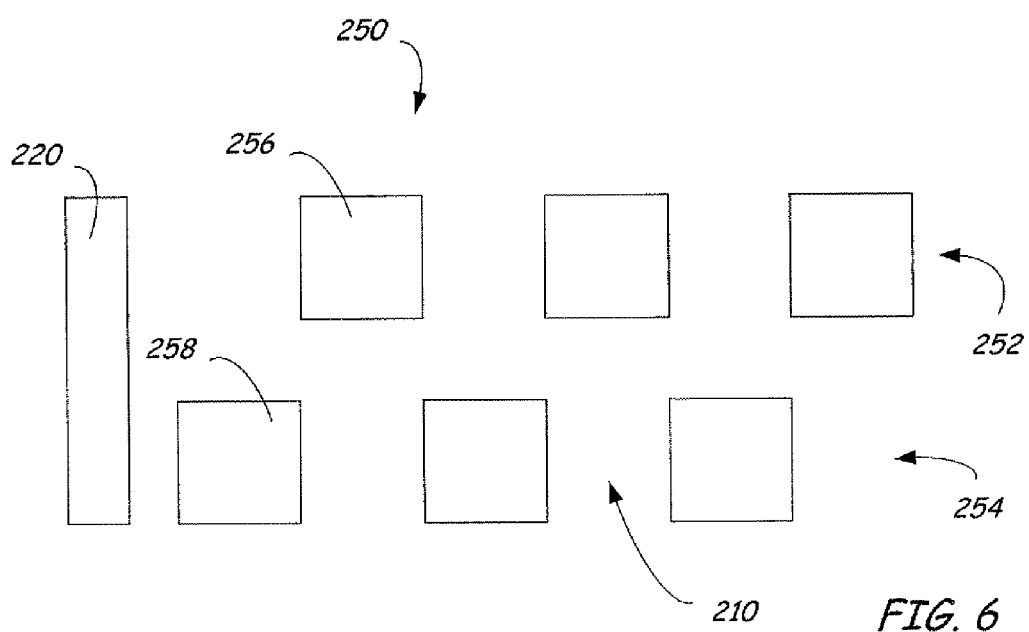
FIG. 6 is a schematic diagram illustrating a data track from a data storage device arranged using a bit pattern media with two rows of bits in a single data track.

FIG. 6 illustrates a portion of a data track 250, which employs a plurality of data bits in a first row 252 and a second row 254. It is understood that the data bits in each of the first row 252 and the second row 254 together comprise the data track 250. The data bit 256 in the first row 252 is linearly offset from or staggered with respect to the data bit 258 in second row 254 so that when the interactive element 220 is positioned over the data bit 258, it is not simultaneously positioned over any portion of the data bit 256. Thus, by providing for staggered rows 252 and 254, data bits 256 and 258 can be read by the data head 220 without any inter-track interference. Such an arrangement allows for more dense collection of data bits on a data track thereby increasing the density of information stored on a particular data medium as compared to the implementation of data track 150.

However, because the data bits 256 and 258 are positioned in discrete locations as opposed to on a conventional storage medium, that is material that includes a continuous track of magnetic material, it is necessary to synchronize the writing process to properly write data onto the data medium. When a data track includes a data medium that is not patterned, it is not necessary to synchronize the process of writing data onto the data medium, because the location of bits on the data medium is not fixed as it is with bit patterned media. Because of the fixed position of the data bits in the bit pattern media, however, any loss of synchronization during the write process can cause a so-called cycle slip. A cycle slip occurs when a mis-synchronization causes a bit of data to be deleted or inserted. Other errors, known as additive bursts can cause data to be improperly written as well.

A cycle slip occurs causes a particular bit not to be written in the proper location or to be written in consecutive locations, thereby shifting the remaining portion of a data string either left or right. When a cycle slip occurs, the remaining portion of a data string is unreliable and prone to errors so that the write process has effectively been compromised. On the other hand, the additive burst need not cause data to be shifted in either direction, but will cause errors to be generated at the locations of the additive bursts. Thus, the detection and correction of errors is an important aspect of reading and writing data onto the bit patterned media, as with any other data storage media. In addition, it is advantageous to reduce the probability that errors will occur.

Figure 7:
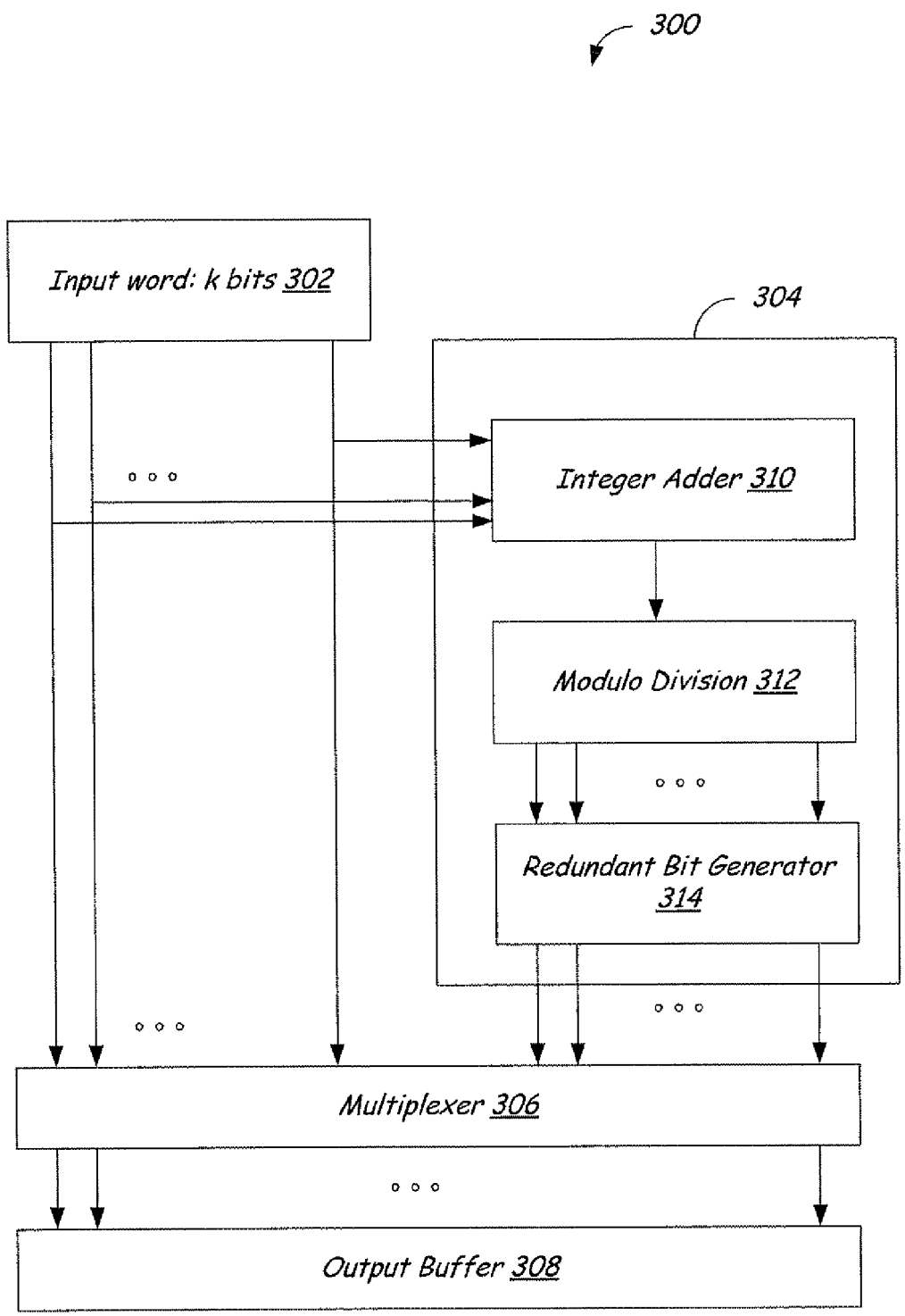
FIG. 7 is a block diagram of an encoder for code correcting deletions or insertions according to one aspect of the invention.

One aspect of the present invention is directed toward the correction of errors, primarily those involving the improper inserting and/or deletion of bits by encoding redundant bits into code words capable of correcting synchronization errors. Referring to FIG. 7, a block diagram of an encoder 300 for code correcting deletions or insertions using, for example, a Varshamov-Tenengolts code is illustrated according to one aspect of the invention. A Varshamov-Tenengolts code $VT_a$ includes all of the vectors $(x_1, x_2, \ldots, x_n)$ that satisfy the following equation:

$$\sum_{i=1}^{n} i \cdot x_i \equiv a \bmod(n+1)$$

for $0 \leq a \leq n$ where the sum is evaluated as an ordinary integer. The table illustrated below shows the number of code words in Varshamov-Tenengolts code $VT_a(n)$ for values of n and a up to eight.

| | | | | a | | | | | |
|---|---|---|---|---|---|---|---|---|---|
| n | 0 | 1 | 2 | 3 | 4 | 5 | 6 | 7 | 8 |
| 1 | 1 | 1 | | | | | | | |
| 2 | 2 | 1 | 1 | | | | | | |
| 3 | 2 | 2 | 2 | 2 | | | | | |
| 4 | 4 | 3 | 3 | 3 | 4 | | | | |
| 5 | 6 | 5 | 5 | 6 | 5 | 5 | | | |
| 6 | 10 | 9 | 9 | 9 | 9 | 9 | 9 | | |
| 7 | 16 | 16 | 16 | 16 | 16 | 16 | 16 | 16 | |
| 8 | 30 | 28 | 28 | 29 | 28 | 28 | 29 | 28 | 28 |

For a=0, the first few such codes are, for n=1 to 5, $VT_0(1)=\{0\}$
$VT_0(2)=\{00, 11\}$
$VT_0(3)=\{000, 101\}$
$VT_0(4)=\{0000, 1001, 0110, 1111\}$
$VT_0(5)=\{00000, 10001, 01010, 11011, 11100, 00111\}$ As can be seen in the table and is shown in the example above, the number of code words (that is, the rate) for each of the first five values of n, given a=0 are 1, 2, 2, 4, and 6, respectively. The Varshamov-Tenengolts codes have been introduced for correcting asymmetric errors in channels and it has been observed that they can correct single deletions and insertions. It should be noted that for large code lengths the Varshamov-Tenengolts codes have rates approaching 1 as $n \to \infty$.

The encoder 300 includes an input buffer 302, which illustratively provides enough room for k user bits, a check bits calculator 304, a multiplexer 306, and an output buffer 308. The multiplexer 306 is configured to receive data bits from the input buffer 302 and the check bits calculator 304 and combines the inputs provided by the input buffer 302 and check bits calculator 304 into a single code word of length n, which is then provided to the output buffer 308. The input buffer 302 also provides its data bits to check bits calculator 304, from which a plurality of redundant bits is calculated.

The checksum calculator illustratively includes an integer adder 310, which is configured to calculate a partial checksum. The partial checksum is then provided to division circuit 312, which is capable of performing modulo n+1 division. The modulo n+1 division is involved in calculation of the partial checksum. The check bits calculator 304 also includes a redundant bit generator 314, which provides a portion of the checksum. The redundant bit generator 314 illustratively includes a logic circuit capable of generating redundant bits. Alternatively or in addition, the redundant bit generator 314 includes memory, which provides a lookup table for providing the bits. Operation of the check bits calculator 304 will be discussed in more detail below. As described above, the check bits generator 304 is in communication with the multiplexer 306 so that it can provide data bits for incorporation into a code word.

Figure 8:
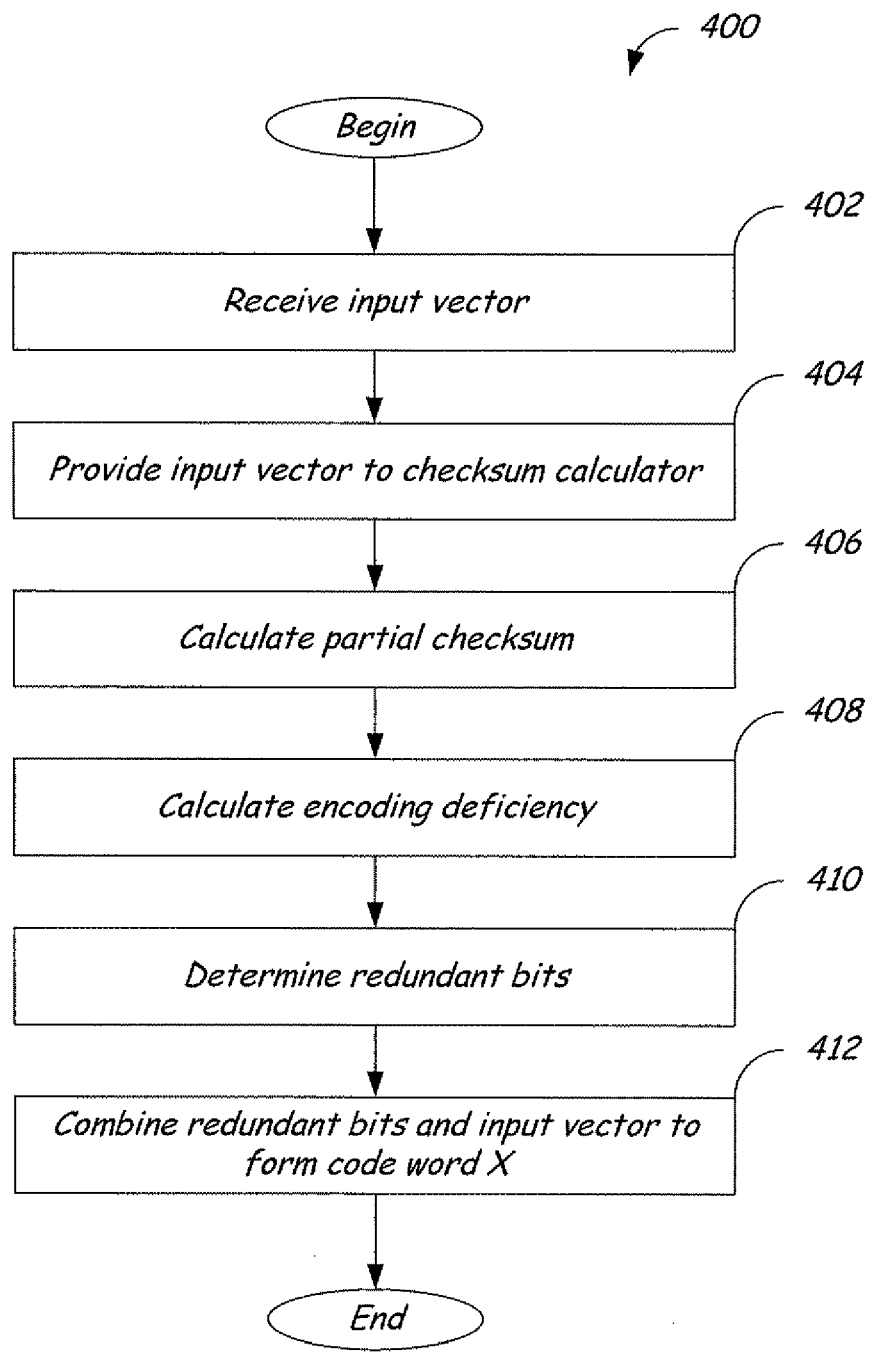
FIG. 8 is a flowchart illustrating a method of creating a code word using the encoder of FIG. 7 according to one particular aspect of the present invention.

FIG. 8 illustrates a method 400 of creating a code word X for storage on a storage device such as a disk drive according to one particular aspect of the present invention. The method 400 illustratively includes receiving an input vector $U=(u_1, u_2, \ldots, u_k)$ at the input buffer 302 as is illustrated in block 402. The input vector $U=(u_1, u_2, \ldots, u_k)$ is provided to the check bits calculator 304. This illustrated in block 404. The check bits calculator 304 then calculates a partial checksum, $\sigma_p$, as is illustrated in block 406. In one aspect of the present invention, the partial checksum $\sigma_p$ is represented as $$\sigma_p = \sum_{i=1}^{k} p(i) \cdot u_i$$

where $P=\{p(1), p(2), \ldots p(k)\}$ is a set of positions in a code word x, that are allocated to the information bits provided by the input buffer 302. Code word X is described as $(x_1, x_2, \ldots x_n)$, where n is $\geq k$ and the number of redundant bits, $m=n-k$. Thus, $x_{p(i)}=u_i$ for all $1 \leq i \leq k$. The remaining m positions of x are illustratively filled by redundant bits $(c_1, c_2, \ldots, c_m)$. If $Q=\{q(1), q(2), \ldots q(m)\}$ represents the set of the positions of the redundant bits in x, then $x_{q(i)}=c_i$ for $1 \leq i \leq m$.

Once the partial checksum is calculated, an encoding deficiency is calculated, which is illustrated in block 408. A minimal multiple of n+1, A, is determined such that $A \geq \sigma_p$. The difference $\Lambda$ is defined as $A-\sigma_p$ and is known as the encoding deficiency. Once the encoding deficiency $\Lambda$ is defined, the redundant bits are determined as is illustrated in block 410. Given the set Q of positions for redundant bits described above, the redundant bits $C=(c_1, c_2, \ldots, c_m)$ are defined so that:

$$\sigma_q = \sum_{i=1}^{m} q(i) \cdot c_i = \Lambda$$

This step is, in one aspect, advantageously performed during a design process by calculating the redundant bits C for all possible values of Λ and storing the values in a lookup table in memory device such as a read only memory (ROM) so that during runtime, determining redundant bits C involves retrieving the stored bits from the lookup table given the value of Λ. Alternatively, a logic circuit can be constructed that is capable of determining redundant bits C.

Once the redundant bits C have been determined, the redundant bits C are combined with the input vector U at multiplexer 306 to form a code word X. This is illustrated at block 412. The positions of the redundant bits C and the bits of input vector U can be located at any locations within code word X. In one illustrative aspect, the redundant bits C are located at positions in code word X corresponding to consecutive powers of two so that $Q=\{1, 2, 4, \ldots, 2^{m-1}\}$. Thus, for a 31 bit code word X having an input vector U with 26 bits, redundant bits are located such that $Q=\{1, 2, 4, 8, 16\}$.

Figure 9:
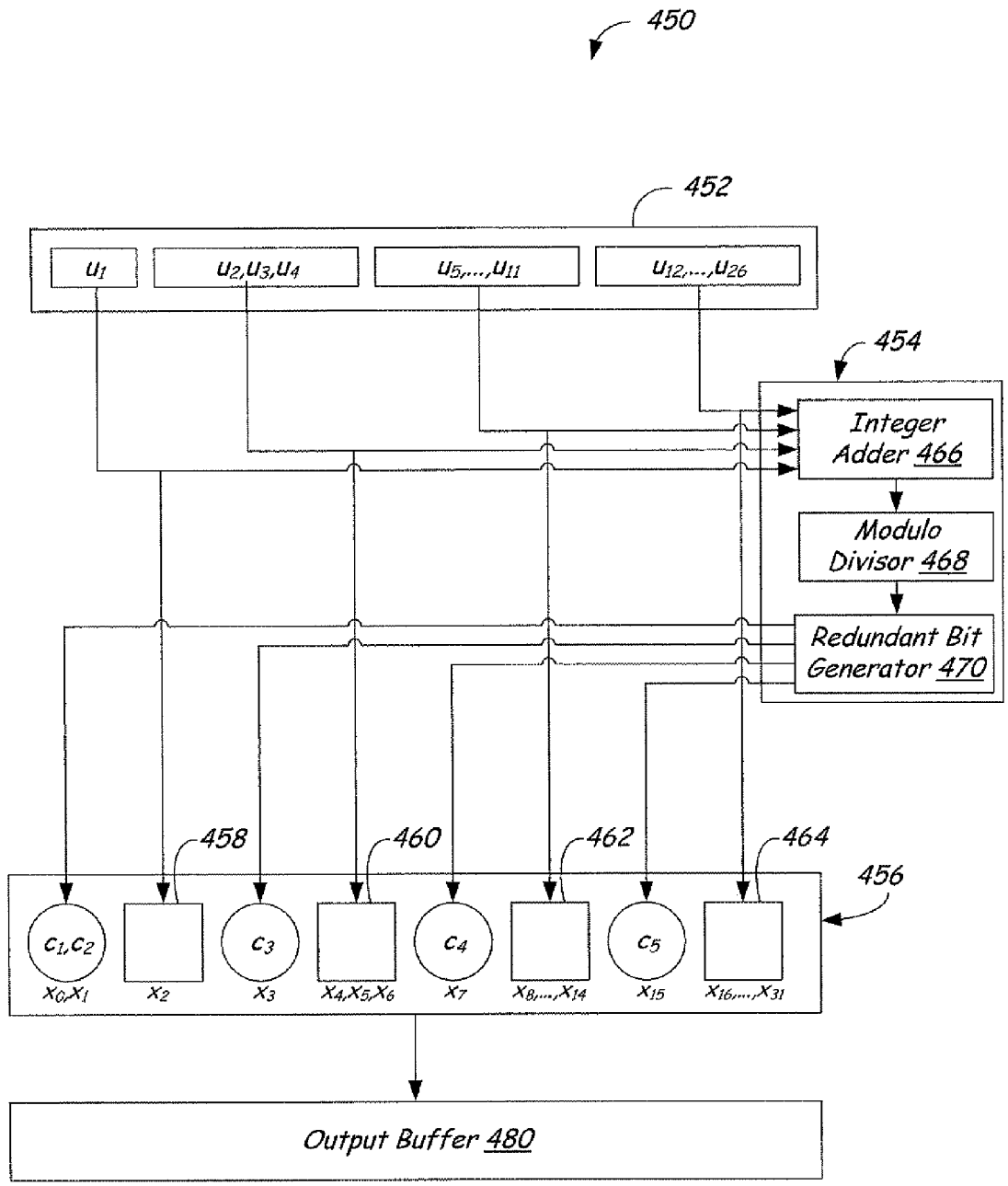
FIG. 9 illustrates an exemplary encoder for code correcting deletions according to one aspect of the invention.

An example of an encoder 450 is illustrated in FIG. 9. Input buffer 452 provides 26 user bits, illustrated as $u_1$ through $u_{26}$. The user bits $u_1$-$u_{26}$ are provided to each of the check bits calculator 454 and the multiplexer 456. The user bits $u_1$-$u_{26}$ are illustratively arranged within the multiplexer 456 in four locations, 458, 460, 462, and 464. The check bits calculator 454 provides a coding deficiency Λ by summing the weighted values of the user bits (by multiplying them by their position in the vector u) in the integer adder 466 and then performing a modulo division of the sum calculated in the integer adder 466 in the modulo divisor 468. In the illustrative embodiment the coding deficiency Λ is used to determine a memory location in a ROM in random bit generator 470. An example of a 32×5 word ROM 490 is illustrated in FIG. 10. The redundancy bits $c_1$-$c_5$ are generated by the random bit generator 470 such as by accessing ROM 490 or alternatively through a logic circuit. The redundancy bits $c_1$-$c_5$ are then provided to locations 472, 474, 476 and 478 in the multiplexer 456. The output of the multiplexer 456 is provided to the output buffer 480.

Figure 11:
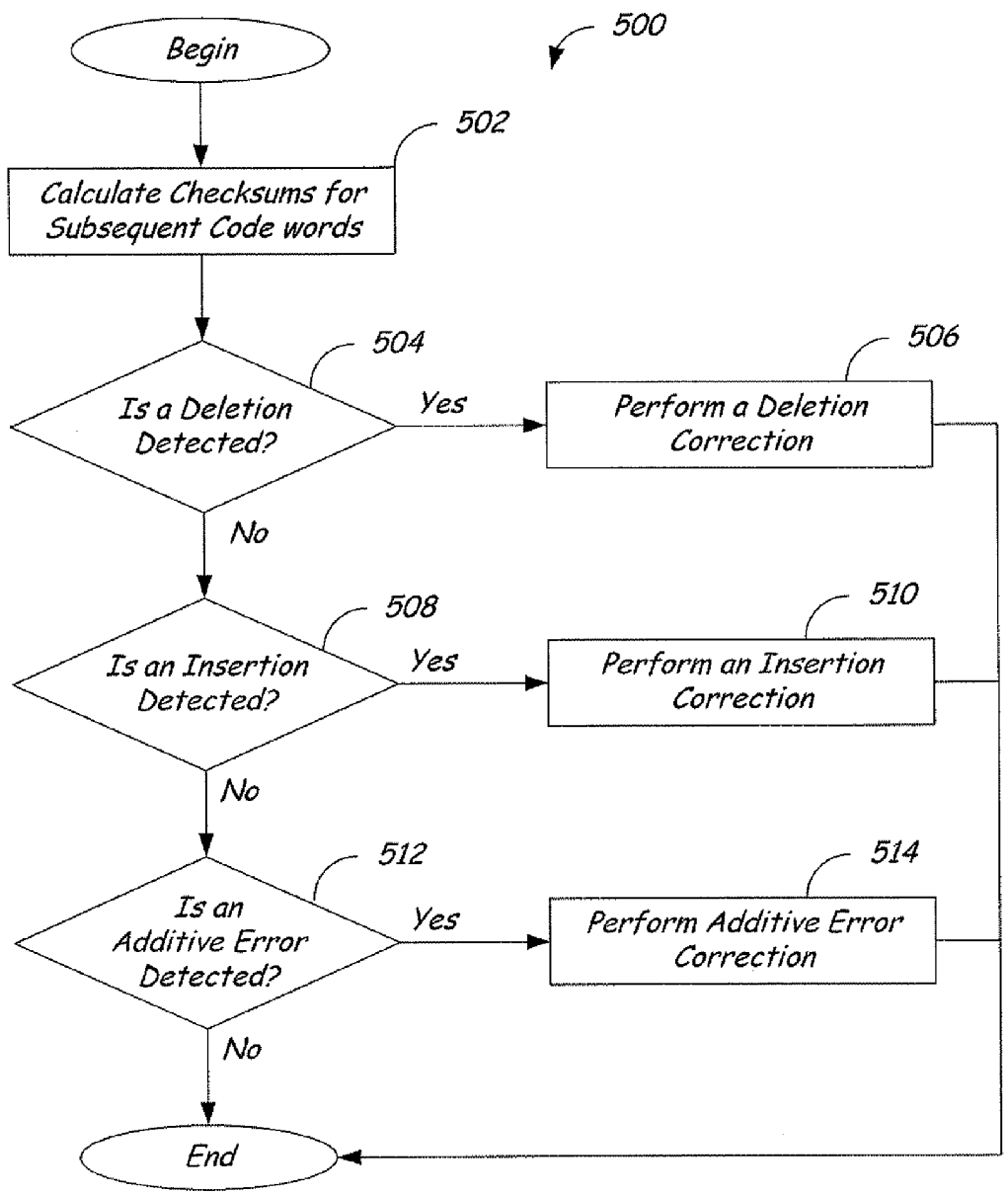
FIG. 11 is a flowchart illustrating a method of identifying a particular type of error as an insertion, deletion, or additive error in a word according to an aspect of the invention.
Figure 12:
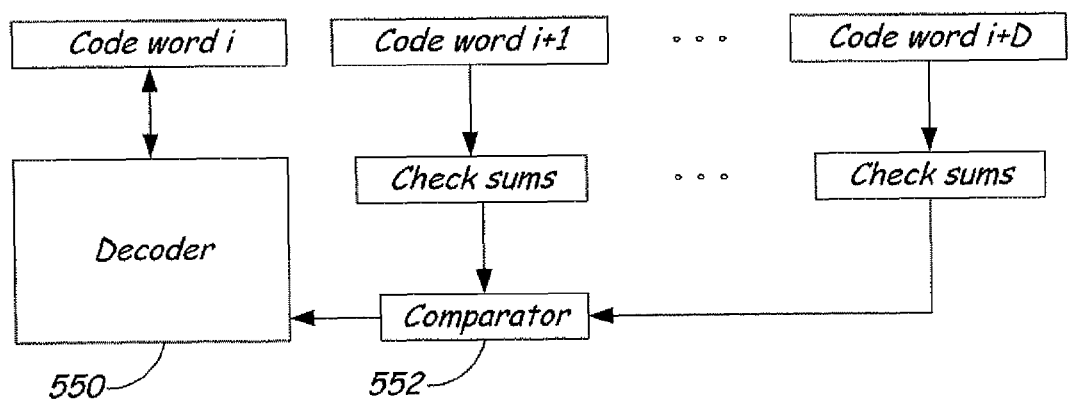
FIG. 12 is a block diagram illustrating a decoder for use in detecting errors in a code word according to an aspect of the invention.

In another aspect of the invention a method 500, illustrated in FIG. 11, for employing a decoder 550 illustrated in FIG. 12 for identifying a particular type of error as an insertion, deletion, or additive error in an incoming word is disclosed. Given an incoming word, i, the method 500 includes calculating checksums for a small number, D, of the subsequent code words to the i-th code word. This is represented by block 502. For each of the D code words subsequent to the i-th code word, (i+1), (i+2), . . . (i+D), left ($S_{left}$), center ($S_{center}$), and right ($S_{right}$) checksums are calculated as is shown in FIG. 12. For each j-th code word, $1 \leq j \geq D$, the $S_{left}$ checksum, $S_{left}(i+j)$ is calculated by shifting the position of the bits of the j-th code word by one bit to the left. Similarly, the $S_{right}$ checksum, $S_{right}(i+j)$ is calculated by shifting the position of the bits of the j-th code word by one bit to the right. The ($S_{center}$) checksum, $S_{center}(i+j)$ is calculated without shifting any of the bits of the j-th code word.

Once the checksums for each of the D code words are calculated, the method 500 determines whether the i-th word has a deletion by providing the checksums to a comparator 552, as is illustrated in block 504. If the comparator 552 determines all of the $S_{left}(i+j)$ checksums, $1 \leq j \geq D$, are zero and all of the $S_{center}(i+j)$ and $S_{right}(i+j)$ checksums are non-zero, the i-th word has a deletion error with a high probability, provided that there are no errors in any of the D code words, and a deletion correction is made by the decoder 550 as is illustrated in block 506.

If it is determined that the i-th code word likely does not have a deletion error (that is, that the above discussed conditions do not exist), the method 500 then determines whether an insertion exists in the i-th code word. This is illustrated in block 508. If the comparator 552 determines that all of the $S_{right}(i+j)$ checksums, $1 \leq j \geq D$, are zero and all of the $S_{center}(i+j)$ and $S_{left}(i+j)$ checksums are non-zero, the i-th word has a deletion error with a high probability, provided that there are no errors in any of the D code words. A deletion correction is then made by the decoder 550 as is illustrated in block 510.

If it is determined that the i-th code word likely does not have an insertion error (that is, that the above discussed conditions do not exist), method 500 then determines whether an additive error exists. This is illustrated in block 512. If the comparator 552 determines that all of the $S_{center}(i+j)$ checksums, $1 \leq j \geq D$, are zero and all of the $S_{left}(i+j)$ and $S_{right}(i+j)$ checksums are non-zero, there is a high probability that the i-th word has an additive error, provided that there are no errors in any of the D code words. An additive error correction is then made by the decoder 550 as is illustrated in block 514. In any other scenario, there are no corrections made with the method 500 illustrated in FIG. 11. In some cases, it is possible that analyzing the next D code words after the code word X will cause an incorrect detection of an insertion or a deletion. An example of such a case is when is there has been an additive burst of more than one bit. However, by analyzing the code words between δ and D, where δ>1, such cases can be avoided.

Figure 13:
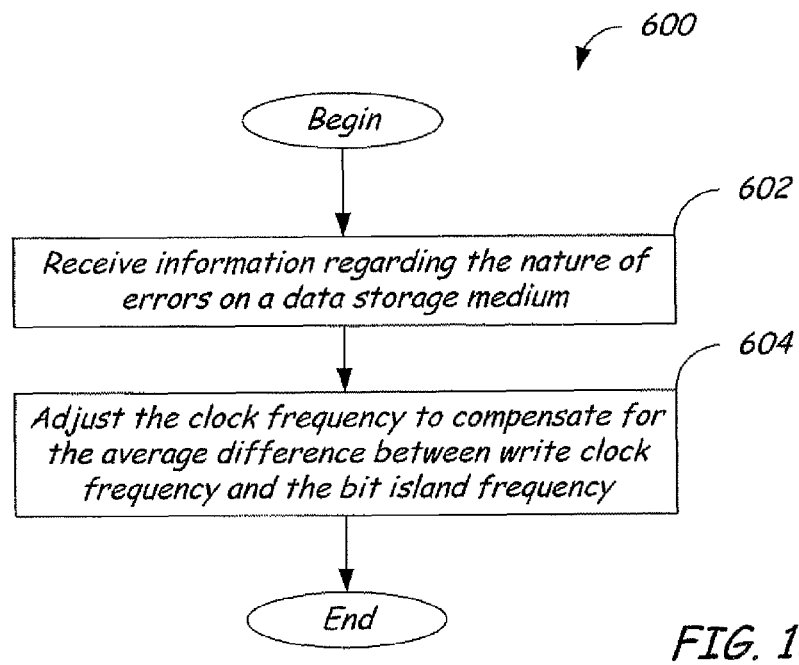
FIG. 13 is a flowchart illustrating a method of reducing the probability of erroneous insertions and/or deletions onto a media device such as the bit patterned media according to an aspect of the invention.
Figure 14:
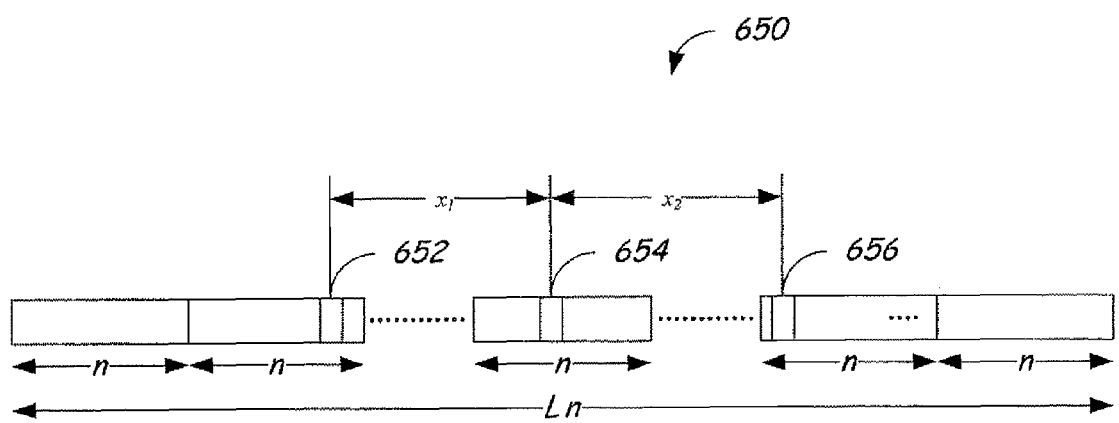
FIG. 14 is a diagram illustrating a data sector having a plurality of deletion errors in words within the sector.

While finding and correcting errors are important capabilities, as discussed above, another aspect of the present invention, illustrated in FIG. 13, includes a method 600 of reducing the probability of erroneous insertions and/or deletions onto a media device such as the bit patterned media discussed above. Method 600 includes receiving information regarding the nature of insertion and/or deletion errors from a media device. FIG. 14 illustrates a data sector 650 from a media device capable of storing L words of data, each having n bits per word. The data sector 650 includes three incidences of deletion of bits, 652, 654, and 656. The distance between the first deletion 652 and the second deletion 654 is indicated by $x_1$. The distance between the second deletion 654 and the third deletion is indicated by $x_2$. From this information, the locations of the deletions (or alternatively, insertions) are identified as is illustrated in block 602.

Once the locations of deletions (or insertions) are identified, the method 600 illustratively adjusts the write clock frequency to compensate for the average difference between the write clock frequency and the bit island frequency, that is, the frequency at which bits are moved into position relative to the write head. This is illustrated in block 604. In the example shown in FIG. 14, the average distance is equal to $$\frac{1}{2(x_1+x_2)/2}.$$

By reducing (or, in case of insertions, increasing) the write clock frequency by the average distance between deletions (or insertions), in this case, $$\frac{1}{2(x_1+x_2)/2},$$

the probability of deletions are likely reduced.

Figure 15:
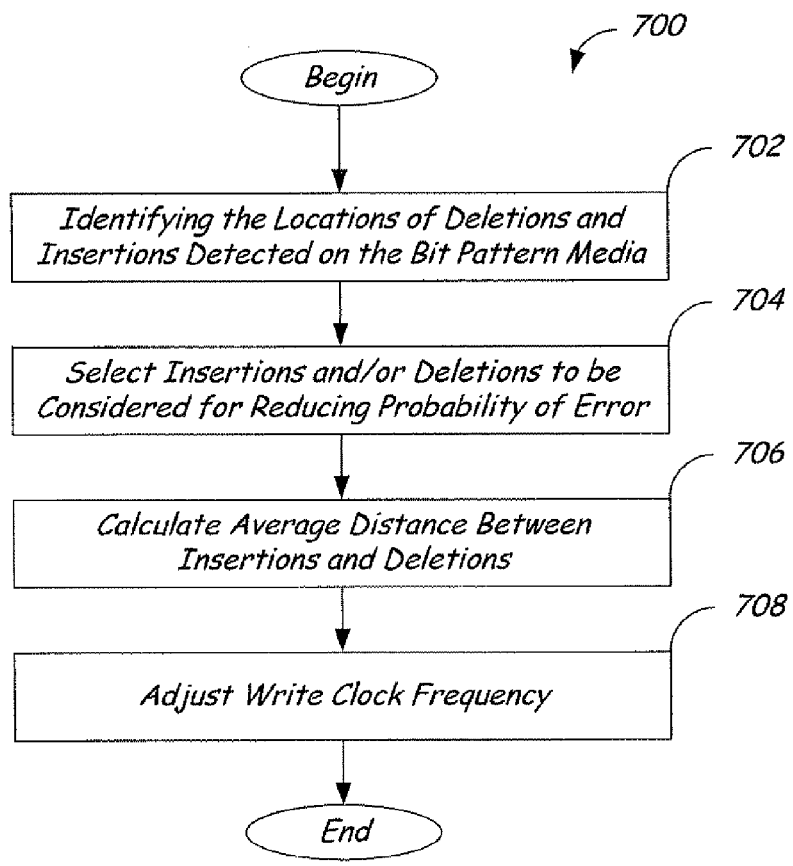
FIG. 15 is a flowchart illustrating a method of identifying the locations of deletions and insertions detected on a bit patterned media according to an aspect of the invention.

It should be appreciated that in some cases, a bit patterned media can have both insertions and deletions in data stored on the media. In such a case, the determining the average difference between the write clock frequency and the bit island frequency requires a more involved method 700, which is illustrated in FIG. 15. Method 700 includes the identifying the locations of deletions and insertions detected on the bit pattern media, as is illustrated in block 702. Once the deletions and insertions have been identified, the method then reduces the number of deletions and/or insertions to be considered in the process of determining an average difference between the write clock frequency and the bit island frequency as is illustrated in block 704. In one aspect, the number of insertions to be considered is reduced by identifying deletions and eliminating from consideration the closest insertion. Alternatively, the number of deletions is reduced by identifying insertions and eliminating from consideration the closest deletion. The average distance between deletions or insertions $x_{av}$ still under consideration is then calculated as in block 706. The write clock frequency is then adjusted as illustrated in block 708. If there were more deletions than insertions, the write clock frequency is reduced by $$\frac{1}{2x_{av}}.$$

If, however, there are more insertions than deletions, the write clock frequency is increased by $$\frac{1}{2x_{av}}.$$

Figure 16:
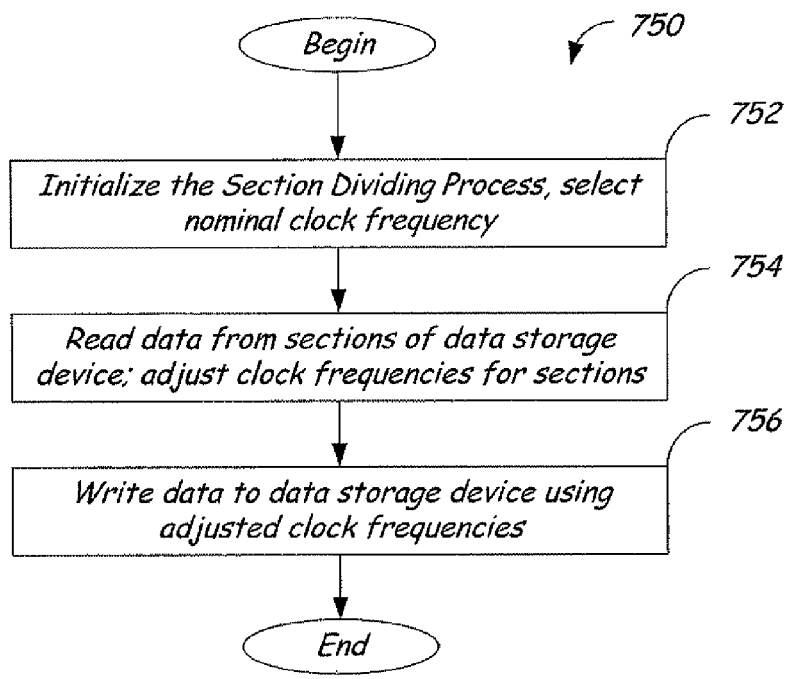
FIG. 16 is a flowchart illustrating a method of reducing the probability of erroneous insertions and/or deletions onto a media device by incorporating a probability reduction method on different sections of the media according to one aspect of the invention.
Figure 17:
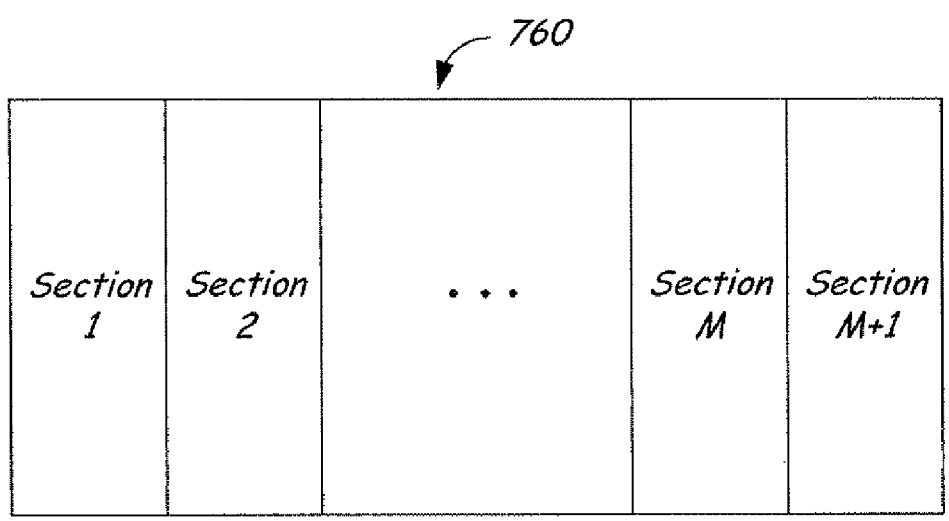
FIG. 17 illustrates a block diagram of a bit patterned media including a plurality of sections on which the probability reduction method of FIG. 16 is illustratively employed.

In yet another aspect of the present invention, a method 750, illustrated in FIG. 16, includes dividing a bit patterned media 760 as illustrated as a block diagram in FIG. 17 into a plurality (for example, M+1) of sections and adjusting the write frequency for each section of the media thereby further reducing the probability of error. It should be appreciated that the sections shown in FIG. 17 are shown for illustrative purposes and are not intended to indicate the relative size, shape, or configuration of any sections on a bit patterned media used in conjunction with the aspect discussed herein. The method 750 includes an initialization step, illustrated in block 752. During the initialization step a nominal clock frequency is chosen and an insertion/deletion code is selected and each are applied to each section of the media surface. During the read process, data is read from the different sections and adjustments are made to the clock frequency and insertion/deletion codes as required. This is illustrated in block 754. For example, each section is illustratively analyzed for insertions and deletions as described in method 700. Correspondingly, each section is given an updated clock frequency as necessary. Such information can be calculated or stored in a look up table for later reference. Once the M+1 sections have been updated, write processes to a particular section are accomplished using the parameters previously determined by the method. This is illustrated in block 756. The result is a more robust data write process that has a lower probability of creating insertion and deletion errors, even though there may be a physical difference between the different sections of the data media. This allows for not only corrections of any anomalies on the data media, but allows for relaxed tolerances during manufacturing such as, for example in lithography processes conducted to create the bit patterned media.

In summary, the illustrative embodiments can provide for the following advantages. By incorporating the methods and systems discussed above, data storage devices such as bit patterned media can be used with additional reliability due to the capability to detect, correct, and/or reduce the probability of certain types of data storage errors. Furthermore, a robust data handling scheme of the type discussed above also illustratively compensates for limitations in the manufacturing process.

It is to be understood that even though numerous characteristics and advantages of the various embodiments have been set forth in the foregoing description, together with details of the structure and function of various embodiments, this disclosure is illustrative only, and changes may be made in detail, especially in matters of structure and arrangement of parts within the principles of the present embodiments to the full extent indicated by the broad general meaning of the terms in which the appended claims are expressed. For example, the particular elements may vary depending on the particular application for the while maintaining substantially the same functionality without departing from the scope and spirit of the present embodiments. In addition, although the embodiments described herein is directed to detecting, correcting and reducing the probability of erroneous insertions or deletions of data on a bit patterned data storage system, it will be appreciated by those skilled in the art that the teachings of the present embodiments can be applied to other data storage systems without departing from the scope and spirit of the present embodiments.

What is claimed is:

1. A method, comprising:
   receiving a first code word from a data storage device; and
   determining whether a data error exists in the code word by analyzing a plurality of subsequent code words.

2. The method of claim 1, wherein analyzing the subsequent code words includes calculating a first checksum for each of the plurality of subsequent code words.

3. The method of claim 2, wherein analyzing the subsequent code words includes analyzing subsequent code words that are all separated from the first code word by at least one code word.

4. The method of claim 2, wherein calculating the first checksum for each of the plurality of subsequent code words includes shifting positions of the subsequent code words in a first direction prior to calculating the first checksum.

5. The method of claim 4 and further comprising:
   shifting positions of the subsequent code words in a second direction; and
   calculating a second checksum for each of the plurality of subsequent code words as shifted.

6. The method of claim 5 wherein determining whether a data error exists in the code word includes analyzing the first and second checksums for each of the plurality of subsequent code words.

7. The method of claim 1, and further comprising decoding the first code word to correct a detected error.

8. The method of claim 1, and further comprising:
   receiving data bits to be stored on the data storage device;
   generating redundant bits related to the data bits; and
   combining the redundant bits with the data bits to form a code word.

9. The method of claim 8, wherein generating redundant bits includes generating a partial checksum for the data bits.

10. The method of claim 8, combining the redundant bits includes positioning the redundant bits in locations corresponding to consecutive powers of an integer.

11. The method of claim 9, wherein generating redundant bits further includes an encoding deficiency based on the partial checksum.

12. The method of claim 11, wherein generating the redundant bits is a function of the encoding deficiency.

13. A method, comprising:
receiving location information of data errors on a data medium; and
adjusting a write clock frequency based on the location information to reduce the probability of creating errors on the data medium during a write process.

14. The method of claim 13, wherein adjusting the write clock frequency includes providing a first write clock frequency for a first portion of the data medium and a second write clock frequency for a second portion of the data medium.

15. The method of claim 13 and further comprising:
calculating an average distance between selected errors based on the location information.

16. The method of claim 14, wherein the data medium is a bit patterned media and wherein adjusting a write clock frequency includes compensating for the difference between the write clock frequency and a bit island frequency.

17. A method, comprising:
receiving a first code word from a data storage device;
calculating first, second, and third checksums for each of a plurality of subsequent code words; and
detecting one of an insertion error and a deletion error in the first code word based on the calculated checksums.

18. The method of claim 17 and further comprising:
correcting the detected error in the first code word based on the calculated checksums by decoding the first code word.

19. The method of claim 17, and further comprising:
adjusting a write clock frequency for a first portion of a bit patterned media based in part upon the error in the first code word.

20. The method of claim 19 and further comprising:
receiving a second code word from the data storage device;
detecting an error in the second code word; and
adjusting a write clock frequency for a second portion of a bit patterned media based in part upon the error in the second code word.

* * * * *